(12) United States Patent
Cao

(10) Patent No.: US 11,869,567 B2
(45) Date of Patent: Jan. 9, 2024

(54) REFRESH CONTROL CIRCUIT AND MEMORY

(71) Applicant: CHANGXIN MEMORY TECHNOLOGIES, INC., Hefei (CN)

(72) Inventor: Xianlei Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 254 days.

(21) Appl. No.: 17/647,234

(22) Filed: Jan. 6, 2022

(65) Prior Publication Data

US 2022/0293167 A1 Sep. 15, 2022

Related U.S. Application Data

(63) Continuation of application No. PCT/CN2021/120355, filed on Sep. 24, 2021.

(30) Foreign Application Priority Data

Mar. 15, 2021 (CN) .......................... 202110276359.1

(51) Int. Cl.
*G11C 16/04* (2006.01)
*G11C 11/406* (2006.01)
*G11C 11/408* (2006.01)

(52) U.S. Cl.
CPC ....... *G11C 11/40611* (2013.01); *G11C 11/408* (2013.01); *G11C 11/4085* (2013.01)

(58) Field of Classification Search
CPC ............. G11C 11/40611; G11C 11/408; G11C 11/4085
See application file for complete search history.

(56) References Cited

U.S. PATENT DOCUMENTS

| 9,336,852 B2 | 5/2016 | Lim et al. |
| 9,431,086 B2 | 8/2016 | Tu et al. |
| 9,536,586 B2 | 1/2017 | Sohn et al. |
| 9,570,143 B2 | 2/2017 | Lim et al. |
| 9,685,218 B2 | 6/2017 | Sohn et al. |

(Continued)

FOREIGN PATENT DOCUMENTS

| CN | 104795097 A | 7/2015 |
| CN | 106128498 A | 11/2016 |

(Continued)

*Primary Examiner* — Pho M Luu
(74) *Attorney, Agent, or Firm* — Syncoda LLC; Feng Ma

(57) ABSTRACT

A refresh control circuit includes: a random output sub-circuit for sequentially receiving n single-row addresses and m single-row addresses in L single-row addresses, a single enabling duration of word lines pointed to by the n single-row addresses being greater than a preset duration, the m single-row addresses ranking top m in occurrence frequency, the L single-row addresses corresponding to word lines turned on between adjacent refresh commands, n being a natural number, and m being a positive integer; and for receiving a first random number which is a positive integer less than or equal to n+m, and then outputting an i-th received single-row address, i being equal to the first random number; and a row hammer address generation sub-circuit for outputting a row hammer address corresponding to the received single-row address acting as a refresh object corresponding to the refresh command.

20 Claims, 1 Drawing Sheet

(56) References Cited

U.S. PATENT DOCUMENTS

| | | |
|---|---|---|
| 10,504,577 B1 | 12/2019 | Alzheimer |
| 10,636,476 B2 | 4/2020 | Nale |
| 10,861,530 B2 | 12/2020 | Yamada et al. |
| 2015/0206572 A1 | 7/2015 | Lim et al. |
| 2015/0243338 A1 | 8/2015 | Sohn et al. |
| 2016/0099043 A1 | 4/2016 | Tu |
| 2016/0329089 A1 | 11/2016 | Lim et al. |
| 2016/0351244 A1 | 12/2016 | Sohn et al. |
| 2017/0263305 A1 | 9/2017 | Cho |
| 2018/0005690 A1 | 1/2018 | Morgan et al. |
| 2018/0190342 A1 | 7/2018 | Morgan et al. |
| 2019/0066759 A1 | 2/2019 | Nale |
| 2019/0122722 A1 | 4/2019 | Yamada et al. |
| 2019/0348107 A1 | 11/2019 | Shin |
| 2023/0067144 A1* | 3/2023 | Cho .................. G11C 11/40615 |
| 2023/0141789 A1* | 5/2023 | Cho ................... G11C 11/4093 |
| | | 365/222 |
| 2023/0185460 A1* | 6/2023 | Kim ....................... G11C 29/12 |
| | | 711/105 |

FOREIGN PATENT DOCUMENTS

| | | |
|---|---|---|
| CN | 108885892 A | 11/2018 |
| CN | 110473577 A | 11/2019 |
| CN | 110491430 A | 11/2019 |
| CN | 111145806 A | 5/2020 |
| CN | 111755047 A | 10/2020 |
| CN | 112767983 A | 5/2021 |
| CN | 112786087 A | 5/2021 |
| WO | 2016083865 A1 | 6/2016 |

\* cited by examiner

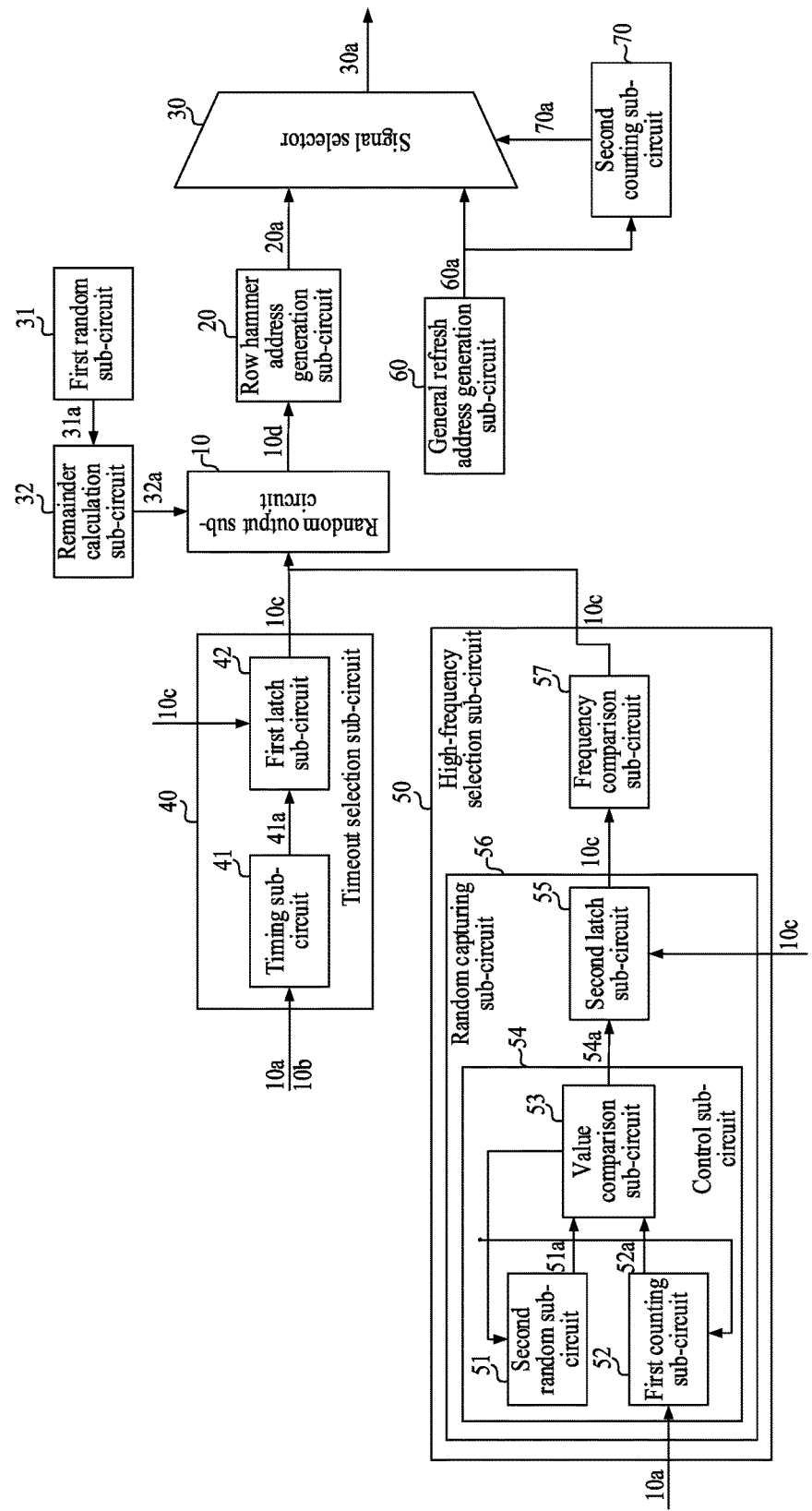

REFRESH CONTROL CIRCUIT AND MEMORY

CROSS-REFERENCE TO RELATED APPLICATIONS

This application is a continuation of International Patent Application No. PCT/CN2021/120355 filed on Sep. 24, 2021, which claims priority to Chinese Patent Application No. 202110276359.1 filed on Mar. 15, 2021. The disclosures of the above-referenced applications are hereby incorporated by reference in their entirety.

BACKGROUND

With increasing density of semiconductor storage devices, memory cells exhibit characteristics including reduced physical volume, storage charge and noise tolerance. The impact of electromagnetic interaction between memory cells on the memory cells increases, and the possibility of memory cell data loss increases.

SUMMARY

Embodiments of the disclosure relate to, but are not limited to, a refresh control circuit and a memory.

Embodiments of the disclosure provide a refresh control circuit, including: a random output sub-circuit, configured to sequentially receive a plurality of single-row addresses, the plurality of single-row addresses including n single-row addresses and m single-row addresses in L single-row addresses, a single enabling duration of word lines pointed to by the n single-row addresses being greater than a preset duration, the m single-row addresses ranking top m in occurrence frequency, the L single-row addresses being corresponding to the word lines turned on between adjacent refresh commands, n being a natural number, and m being a positive integer; and configured to receive a first random number, the first random number being a positive integer less than or equal to n+m, and after receiving the first random number, output an i-th received single-row address, i being equal to the first random number; a row hammer address generation sub-circuit, connected to an output end of the random output sub-circuit, and configured to output a row hammer address corresponding to the received single-row address; and a signal selector, configured to receive a general refresh address and the row hammer address, and output address information, the address information being the row hammer address or the address information being the row hammer address and the general refresh address, and the address information acting as a refresh object corresponding to the refresh command.

The embodiments of the disclosure further provide a memory, including the refresh control circuit.

BRIEF DESCRIPTION OF THE DRAWINGS

One or more embodiments are illustrated by way of example with reference to the FIGURE in the corresponding accompanying drawing. Unless otherwise particularly stated, the FIGURE in the accompanying drawing is not drawn to scale.

Unless otherwise defined, all technical and scientific terms used herein have the same meanings as those skilled in the art of the disclosure generally understand. The terms used herein in the specification of the disclosure are for the purpose of describing specific embodiments only and are not intended to limit the disclosure.

It should be understood that when an element or layer is referred to as being "on", "adjacent to", "connected to" or "coupled to" other elements or layers, it can be directly on other elements or layers, or can be adjacent to, connected to, or coupled to other elements or layers, or intervening elements or layers may be present. In contrast, when an element is referred to as being "directly on", "directly adjacent to", "directly connected to" or "directly coupled to" other elements or layers, there are no intervening elements or layers. It should be understood that although the terms "first", "second", "third", and the like may be used to describe various elements, components, regions, layers, doping types, and/or portions, these elements, components, regions, layers, doping types, and/or portions should not be limited by these terms. These terms are used only to distinguish one element, component, region, layer, doping type or portion from another element, component, region, layer, doping type or portion. Thus, without departing from the teachings of the disclosure, the first element, component, region, layer, doping type or portion discussed below may be represented as a second element, component, region, layer or portion.

Spatial relationship terms such as "under . . . ", "below . . . ", "below", "underneath . . . ", "above", "on", etc., can be used to describe a relationship between one element or feature shown in the FIGURE and other elements or features. It should be understood that in addition to the orientations shown in the FIGURES, the spatial relationship terms also include different orientations of devices in use and operation. For example, if the device in the FIGURES is turned over, elements or features described as "below other elements" or "under . . . " or "under" will be oriented "on" the other elements or features. Therefore, the exemplary terms "below . . . " and "under . . . " can include both an orientation of above and below. In addition, the device may also include other orientations (for example, rotated by 90 degrees or other orientations), and the space descriptors used herein are interpreted accordingly.

When used herein, the singular forms "one", "a(an)" and "the said/this" may also include plural forms, unless the context clearly dictates otherwise. It should also be understood that when the terms "composition" and/or "including" are used in this specification, the existence of the described features, integers, processes, operations, elements and/or components can be determined, but the presence or addition of one or more other features, integers, processes, operations, elements, components and/or groups are not excluded. Meanwhile, when used herein, the term "and/or" includes any and all combinations of related listed items.

FIG. 1 is a schematic diagram of a functional structure of a refresh control circuit according to an embodiment of the disclosure.

DETAILED DESCRIPTION

To make objectives, technical solutions, and advantages of the embodiments of the disclosure clearer, the embodiments of the disclosure will be described in detail below with reference to the accompanying drawings. However, persons skilled in the art may understand that in the embodiments of the disclosure, numerous technical details are described for readers to better understand the disclosure. However, the technical solutions claimed in the disclosure may also be implemented even if in the absence of the technical details and various changes and modifications based on the following embodiments.

When a word line corresponding to a certain single-row address in a memory cell is frequently turned on or is turned on for a long time, a leakage rate of a capacitor of an adjacent address (generally referred to as "a row hammer address") may be higher than a natural leakage rate, thereby causing data loss of the capacitor of the adjacent address due to excessive charge loss before a refresh signal arrives, which is generally referred to as a "row hammer effect". To suppress the row hammer effect, the row hammer address needs to be refreshed timely to replenish the charge, thereby avoiding errors in storage data.

With reference to FIG. 1, a refresh control circuit includes a random output sub-circuit 10. The random output sub-circuit 10 is configured to sequentially receive a plurality of single-row addresses 10c. The plurality of single-row addresses 10c includes n single-row addresses 10c and m single-row addresses 10c in L single-row addresses 10c. A single enabling duration of word lines pointed to by the n single-row addresses 10c is greater than a preset duration. The m single-row addresses 10c ranks top m in occurrence frequency. The L single-row addresses 10c are corresponding to the word lines turned on between adjacent refresh commands, n being a natural number, and m being a positive integer. The random output sub-circuit 10 is further configured to receive a first random number 32a. The first random number 32a is a positive integer less than or equal to n+m. After receiving the first random number 32a. The random output sub-circuit 10 is further configured to output an i-th received single-row address 10c, i being equal to the first random number 32a. The refresh control circuit also includes a row hammer address generation sub-circuit 20. The row hammer address generation sub-circuit 20 is connected to an output end of the random output sub-circuit 10 and is configured to output a row hammer address 20a corresponding to the received single-row address 10c, the row hammer address 20a acting as a refresh object corresponding to the refresh command. The refresh control circuit also includes a signal selector 30. The signal selector 30 is configured to receive a general refresh address 60a and the row hammer address 20a, and output address information 30a. The address information 30a may be the row hammer address 20a or the address information may be the row hammer address 20a and the general refresh address 60a. The address information acts as a refresh object corresponding to the refresh command.

The L single-row addresses 10c, which point to a word line that has a single enabling duration greater than a preset duration, may be referred to as timeout addresses. The L single-row addresses ranking top m in occurrence frequency may referred to as high-frequency addresses. For the n timeout addresses and the m high-frequency addresses, the random output sub-circuit 10 has no requirement for a receiving order. That is, the n timeout addresses and the m high-frequency addresses may be received simultaneously, or, the n timeout addresses or the m high-frequency addresses may be first received, or, the n timeout addresses and the m high-frequency addresses may be received in a mixed manner. Herein, the random output sub-circuit 10 may perform one-by-one reception according to an actual transmission order of the timeout addresses and the high-frequency addresses.

The row hammer address 20a is an adjacent address of the single-row address 10c outputted by the random output sub-circuit 10. Specifically, when the single-row address 10c is x, and x is a positive integer, the row hammer address 20a may include a first single-row address and a second single-row address, the first single-row address being x−1, and the second single-row address being x+1. It should be noted that the row hammer address 20a is a general name of adjacent addresses, in sub-circuits of "group". A group of row hammer addresses 20a may include one or more adjacent addresses of one single-row address 10c. In some embodiments, the row hammer address may include only x+1 or x−1, or at least one of x+2 or x−2.

In this embodiment, detailed description is made based on an example that the random output sub-circuit 10 receives a first random number 32a and outputs a single-row address 10c corresponding to the first random number 32a, and the row hammer address 20a outputted by the row hammer address generation sub-circuit 20 includes two single-row addresses 10c. In other embodiments, the random output sub-circuit may receive a first random number and output a plurality of single-row addresses based on the first random number. For example, after receiving a first random number with a value i, the random output sub-circuit may output ith, (i+1)th, and (i+2)th received single-row addresses, or receive a plurality of first random numbers and output a plurality of single-row addresses corresponding to the plurality of first random numbers.

In this embodiment, the random output sub-circuit 10 is configured to sequentially receive and sequentially store a plurality of single-row addresses 10c, and to output a seed address 10d after receiving the first random number 32a, the seed address 10d including the i-th received single-row address 10c. The random output sub-circuit 10 is further configured to delete the stored seed address 10d after outputting the seed address 10d. It should be noted that the single-row address 10c is referred to as the seed address 10d only after being outputted by the random output sub-circuit 10. All the outputted single-row addresses 10c are referred to as the seed addresses 10d. The deleting the stored seed address 10d refers to deleting the single-row address 10c which is outputted and referred to as the seed address 10d.

When the random output sub-circuit 10 needs to randomly output two single-row addresses 10c, the random output sub-circuit 10 may first output a single-row address 10c, then delete the stored single-row address 10c, and then randomly select a single-row address 10c from the remaining stored single-row addresses 10c according to a new first random number 32a and output the same. When the random output sub-circuit 10 needs to randomly output three or more single-row addresses 10c, the above actions may be repeatedly performed. In this way, it is beneficial to avoid repeatedly outputting the same single-row address 10c as the seed address 10d, and avoid waste of refresh resources caused by repeated refreshing of the same row hammer address 20a. In addition, it is beneficial to improve the output probability of the L single-row addresses 10c which are not outputted, so that the output probability of different single-row addresses 10c is close.

For example, it is assumed that the random output sub-circuit 10 receives 20 single-row addresses 10c. When a first single-row address 10c (A) is outputted, the output probability of A is $1/20$, and when a second single-row address 10c is outputted but the stored A is not deleted, the A still has an output probability of $1/20$. In this way, the total output probability of the A becomes $1/10$, the output probability of other single-row addresses 10c is still $1/20$, and the difference between the two is $1/20$. If the stored A is deleted, the output probability of other single-row addresses 10c becomes $1/19$, the output probability of the A remains $1/20$, and the difference between the two is $1/380$. The smaller the difference is, the closer the output probability of different single-row addresses 10c is, and the better the outputting effect of the random output sub-circuit 10 is.

When the random output sub-circuit 10 only outputs a single-row address 10c, the remaining stored n+m−1 single-row addresses 10c may, together with the next batch of received n+m single-row addresses 10c, wait for a random output when a next refresh command arrives. In this case, the probability of outputting any single-row address 10c by the random output sub-circuit 10 is 1/(2n+2m−1). In other embodiments, in order to ensure that the random output probability of the first outputted single-row address 10c in each batch of received single-row addresses 10c is 1/(n+m), the random output sub-circuit is further configured to delete all the stored single-row addresses after outputting the seed address.

It should be noted that before deleting all the stored single-row addresses, the seed address 10d outputted by the random output sub-circuit may include one or more single-row addresses 10c, and the number of the outputted single-row addresses 10c may be determined and adjusted in real time according to actual conditions.

In this embodiment, the refresh control circuit may further include: a first random sub-circuit 31, configured to randomly generate and output a first positive integer 31a; and a remainder calculation sub-circuit 32, respectively connected to the random output sub-circuit 10 and the first random sub-circuit 31, and configured to obtain a value of n+m and the first positive integer 31a, and calculate a remainder of the first positive integer 31a divided by the value of n+m, and output a value of the remainder plus 1 as the first random number 32a. The remainder calculation sub-circuit 32 may actively obtain the value of n+m from the random output sub-circuit 10, or may passively receive the value of n+m outputted by the random output sub-circuit 10 to the remainder calculation sub-circuit 32.

In this embodiment, the refresh control circuit may further include: a timeout selection sub-circuit 40, connected to an input end of the random output sub-circuit 10, and configured to: sequentially receive L row activation commands 10a, L pre-charging commands 10b, and L single-row addresses 10c corresponding to the L row activation commands 10a, each row activation command 10a corresponding to a single-row address 10c, the row activation command 10a being configured to turn on a word line pointed to by the single-row address 10c, and the pre-charging command 10b being configured to turn off the word line; and when a single enabling duration of n word lines is greater than the preset duration, output the n single-row addresses 10c corresponding to the n word lines, wherein 0≤n≤L.

When the single enabling duration determined by the row activation commands 10a and the pre-charging commands 10b is greater than the preset duration, then the adjacent word lines of the word lines pointed to by the row activation commands 10a may have a row hammer effect, and there may be a data storage error. It should be noted that the preset duration may be a fixed value, or may be a dynamic value that varies with changes in environmental parameters. For example, as the temperature changes, the natural leakage speed of a capacitor may be accelerated, and then the preset duration may be shorter.

In this embodiment, the timeout selection sub-circuit 40 may include: a timing sub-circuit 41, configured to receive the row activation commands 10a and the pre-charging commands 10b to obtain the single enabling duration, and when the single enabling duration is greater than the preset duration, output timeout signals 41a; and a first latch sub-circuit 42, connected to an output end of the timing sub-circuit 41, and configured to: receive each of the L single-row addresses 10c one by one, and receive, one by one, each timeout signal 41a outputted by the timing sub-circuit 41, so as to output n single-row addresses 10c corresponding to the n timeout signals 41a; and when the timeout signals 41a are received, output the last received single-row address 10c before the timeout signals 41a arrive.

When the timing sub-circuit 41 receives the row activation command 10a, the first latch sub-circuit 42 may receive the single-row address 10c corresponding to the word line pointed to by the row activation command 10a. The single enabling duration of the word line may be determined by a reception time interval between the preceding row activation command 10a and the next pre-charging command 10b pointing to the same word line.

In this embodiment, the refresh control circuit may further include: a high-frequency selection sub-circuit 50, connected to an input end of the random output sub-circuit 10, and configured to receive the L single-row addresses 10c, and output, one by one, m single-row addresses ranking top m in occurrence frequency in the L single-row addresses 10c. In this way, single-row addresses 10c which may cause a row hammer effect may be obtained, thereby avoiding data storage errors of adjacent word lines caused by frequent enabling of the word lines.

The L single-row addresses 10c received by the high-frequency selection sub-circuit 50 may be the same as the L single-row addresses received by the timeout selection sub-circuit 40, and a difference may lie in that there are no repeated addresses in the m single-row addresses 10c outputted by the high-frequency selection sub-circuit 50, and the n single-row addresses 10c outputted by the timeout selection sub-circuit 40 may have repeated single-row addresses 10c. On this basis, when the random output sub-circuit 10 outputs two single-row addresses 10c, one single-row address can be randomly selected from the n single-row addresses 10c outputted by the timeout selection sub-circuit 40, and the other single-row address can be randomly selected from the m single-row addresses 10c outputted by the high-frequency selection sub-circuit 50, thereby facilitating reducing the probability of outputting the same single-row address 10c, ensuring timely refresh of the row hammer address 20a corresponding to the two single-row addresses 10c, and avoiding the waste of refresh resources.

In this embodiment, m is greater than 1, thereby facilitating suppressing errors caused by random capturing, and ensuring that the L single-row addresses with the highest occurrence frequency are included in the outputted single-row addresses, so as to realize accurate refresh of the row hammer addresses. In other embodiments, m may be equal to 1.

When the actual number of the top m single-row addresses is greater than m because of a parallel situation, m single-row addresses may be randomly outputted from the top m single-row addresses, or single-row addresses which are of top ranks and have no repetition may be first outputted, and then the remaining single-row addresses may be randomly outputted from the plurality of single-row addresses which are of bottom ranks in parallel, or all the top m single-row addresses may be outputted.

It should be noted that, in addition to the fixed value, a value of m may also be a variable value. Specifically, the top m single-row addresses refer to single-row addresses with the occurrence frequency greater than a preset frequency, and a value of m is equal to the number of the single-row addresses with the occurrence frequency greater than the preset frequency. When the occurrence frequency of a single-row address is greater than the preset frequency, the data storage error of a word line pointed to by adjacent single-row address may be caused. Therefore, a frequency comparison sub-circuit may output all row hammer addresses which may have a data storage error, so as to avoid the data storage error as much as possible.

In this embodiment, the high-frequency selection sub-circuit 50 may include: a random capturing sub-circuit 56, configured to receive the L single-row addresses 10$c$, and randomly output b single-row addresses 10$c$ in the L single-row addresses 10$c$; and the frequency comparison sub-circuit 57, connected to an output end of the random capturing sub-circuit 56, and configured to analyze and output m single-row addresses 10$c$ ranking top m in occurrence frequency in the b single-row addresses 10$c$.

A random capturing operation performed by the random capturing sub-circuit 56 is to reduce the number of address samples, i.e., reducing address samples from single-row addresses 10$c$ to b single-row addresses 10$c$. When the frequency comparison sub-circuit 57 analyzes the single-row addresses 10$c$ with the highest occurrence frequency on the basis of the address samples, the address sampleS may include a small number of single-row addresses 10$c$, which is beneficial to improve the analysis rate of the frequency comparison sub-circuit 57 and reduce the occupation of the frequency comparison sub-circuit 57 on computing resources in the analysis process.

In addition, compared with a regular output mode such as an equal-difference output, the use of a random capturing mode for outputting an address sample facilitates avoiding a large impact of a regular output mode on repeated single-row addresses 10$c$ having regularity in L single-row addresses 10$c$, so that an output result is more representative, that is, a ratio of the occurrence frequency of different single-row addresses 10$c$ in the output result can be closer to a ratio of the occurrence frequency of different single-row addresses 10$c$ in original samples, thus realizing timely and accurate refresh of the row hammer address 20$a$.

For example, in the original samples containing single-row addresses 10$c$, there may be a specific single-row address that is regularly repeated. For example, a specific single-row address may appear every S single-row addresses 10$c$, and the specific single-row address is a single-row address 10$c$ with the highest occurrence frequency. In this case, when the equal-difference output mode is used for output, that is, a single-row address 10$c$ is outputted every K single-row addresses 10$c$, when K is equal to s, and the initially outputted single-row address 10$c$ is not the specific single-row address, the specific single-row address can never be outputted, and then the row hammer address 20$a$ corresponding to the specific single-row address cannot be refreshed timely. Instead, the use of the random output mode may avoid this problem.

The example "a specific single-row address appears every S single-row addresses, and S is a fixed value" is merely taken as an example of regularity. Actually, there are many examples of regularity, for example, S may be a numerical value which cyclically changes, such as cycling in an order of, for example, 13571357 . . . .

It should be noted that, even if it is not common that the regularity of the single-row addresses and the regularity of the output action are the same, the situation still may occur. In addition, when a memory is attacked by a malicious program such as a virus program, if the malicious program may replicate the regularity of an output action, then a specific single-row address can be accessed with the same regularity. As long as an initial access address of the malicious program is different from an initial output address regularly outputted, the regular output may be permanently evaded, thereby evading the refresh of the row hammer address, and causing data stored in the memory to have a large-area error.

Since the malicious program needs to replicate the regularity of an output mode, and the regular output may be evaded only when an initially accessed single-row address 10$c$ is different from an initially outputted single-row address 10$c$, the output result is thus not representative. That is, a specific single-row address which is actually frequently accessed by the malicious program cannot be outputted. Therefore, the single-row address 10$c$ may be output selectively by using a random output mode that cannot perform replication, so as to improve the representativity of the output result, such that when the memory is attacked by a malicious program, a refresh command may timely and effectively refresh the row hammer address 20$a$ that may have a data error.

In this embodiment, the random capturing sub-circuit 56 may include: a control sub-circuit 54, configured to generate and output trigger signals 54$a$ at b random time points; and a second latch sub-circuit 55, configured to: receive each of the L single-row addresses 10$c$ one by one, and receive, one by one, each trigger signal 54$a$ outputted by the control sub-circuit 54, so as to output b single-row addresses 10$c$ corresponding to the b trigger signals 54$a$; and when the trigger signals 54$a$ are received, output the last received single-row address 10$c$ before the trigger signals 54$a$ arrive.

The second latch sub-circuit 55, after receiving a single-row address 10$c$, may retain the single-row address 10$c$. When the second latch sub-circuit 55 receives a trigger signal 54$a$ prior to receiving the next single-row address 10$c$, the second latch sub-circuit 55 may latch and output the single-row address 10$c$. When the second latch sub-circuit 55 first receives the next single-row address 10$c$, the second latch sub-circuit 55 may discard the retained single-row address 10$c$, and retain the next single-row address 10$c$.

In this embodiment, the control sub-circuit 54 may include: a second random sub-circuit 51, configured to generate and output a second random number 51$a$, the second random number 51$a$ being a positive integer; a first counting sub-circuit 52, configured to receive L row activation commands 10$a$ one by one, and count the number of the received row activation commands 10$a$ to output a first count value 52$a$, each row activation command 10$a$ corresponding to a single-row address 10$c$, and the L row activation commands 10$a$ corresponding to single-row addresses 10$c$; and a value comparison sub-circuit 53, connected to an output end and a reset end of the second random sub-circuit 51, connected to an output end and a reset end of the first counting sub-circuit 52, connected to an input end of the second latch sub-circuit 55, and configured to: receive the second random number 51$a$ and the first count value 52$a$; and when the first count value 52$a$ is equal to the second random number 51$a$, output the trigger signals 54$a$, and reset the second random sub-circuit 51 and the first counting sub-circuit 52, to enable the second random sub-circuit 51 to generate and output a new second random number 51$a$, and to enable the first counting sub-circuit 52 to count from zero again.

In this embodiment, the second random number 51$a$ may be less than or equal to 20. In this way, it is beneficial to ensure that the randomly outputted b single-row addresses 10$c$ have a certain number of samples, thereby avoiding affecting the representativity of the output result of the random capturing sub-circuit 56 due to too few samples, and facilitating accurately refreshing the row hammer address 20a.

In this embodiment, the signal selector 30 is further configured to receive a selection signal 70a. Before receiving the selection signal 70a, the signal selector 30 is further configured to receive and output each general refresh address 60a sequentially; and after receiving the selection signal 70a, the signal selector 30 is further configured to stop outputting the general refresh address 60a, and receive and output each row hammer address 20a sequentially. The selection signal 70a represents that the signal selector 30 has received j–2 general refresh addresses 60a. j is the number of refresh rows corresponding to each refresh command, and j>2.

In other embodiments, the selection signal represents that the signal selector has received j-q general refresh addresses, wherein j>q. q may be obtained by multiplying the group number of row hammer addresses outputted by the signal selector by the number of adjacent addresses contained in each group of row hammer addresses. In addition, in other embodiments, an actual output mode of the signal selector may be: before receiving the row hammer address, receiving and outputting each general refresh address; when the row hammer address is received, stopping outputting the general refresh address, and outputting each group of received row hammer addresses; and after outputting the row hammer addresses, continuing receiving and output each general refresh address.

In this embodiment, the refresh control circuit may further include: a second counting sub-circuit 70, configured to count the number of the general refresh addresses 60a received by the signal selector 30 to obtain a second count value, and when the second count value is equal to j–2, output the selection signal 70a.

It can be known that the selection signal 70a is an identification signal outputted by the second counting sub-circuit 70, and is configured to switch a switch for the signal selector 30 to receive the row hammer address 20a and the general refresh address 60a, so that a path between the signal selector 30 and a general refresh address generation sub-circuit 60 is turned off, while a path between the signal selector 30 and the row hammer address generation sub-circuit 20 is turned on, thereby receiving and outputting the row hammer address 20a. In addition, the identification signal may be the second count value itself.

In this embodiment, after the signal selector 30 outputs the general refresh addresses 60a and the row hammer addresses 20a accurately, after the signal selector 30 outputs j–2 general refresh addresses 60a and a group of row hammer addresses 20a, the signal selector 30 may reset the second counting sub-circuit 70 to stop outputting the selection signal 70a, and control the second counting sub-circuit 70 to count from zero again to wait for the next refresh command REF, thereby repeatedly executing the foregoing output processes, that is, first outputting j–2 general refresh addresses 60a and then outputting a group of row hammer addresses 20a.

In this embodiment, the second counting sub-circuit 70 is further configured to: write and update the value of j–2; and after updating the value of j–2, when the second count value is equal to the updated j–2, then output the selection signal 70a. In this way, it is beneficial to timely update the value of the j–2 according to the strategy of outputting the row hammer address 20a by the signal selector 30, thereby ensuring completion of refresh of the row hammer address 20a within the number of refresh rows corresponding to the refresh command, or performing the refresh of the row hammer address 20a over the number of refresh rows corresponding to the refresh command.

In this embodiment, the refresh control circuit may further include a general refresh address generation sub-circuit 60, configured to generate and output at least one general refresh address 60a. An output end of the general refresh address generation sub-circuit 60 is connected to an input end of the signal selector 30 and an input end of the second counting sub-circuit 70 respectively. The second counting sub-circuit 70 is configured to receive at least one of the general refresh addresses 60a outputted by the general refresh address generation sub-circuit 60.

In this embodiment, after a timeout enabled single-row address and a frequently enabled single-row address are received, corresponding received single-row addresses may be output according to the first random number. Since the first random number is a random value, the output opport-sub-circuitry is the same for all the received single-row addresses. That is to say, the refresh control circuit may output row hammer addresses corresponding to different enabling issues, thereby avoiding a bias to a certain enabling issue.

Correspondingly, the embodiments of the disclosure further provide a memory, including the refresh control circuit of any one of the foregoing. The memory may perform refresh of row hammer addresses corresponding to different enabling issues, and the row hammer addresses may be refreshed with respect to regular refresh addresses, thereby realizing fair and timely refresh of different row hammer addresses.

Persons skilled in the art may understand that the foregoing implementations are specific embodiments for implementing the disclosure, but in actual application, various changes can be made thereto in form and in detail without departing from the spirit and the scope of the disclosure. Any person skilled in the art can make various changes and modifications without departing from the spirit and the scope of the disclosure. Therefore, the protection scope of the disclosure should be subject to the scope defined by the claims.

What is claimed is:

1. A refresh control circuit, comprising:
 a random output sub-circuit, configured to:
  sequentially receive a plurality of single-row addresses, wherein the plurality of single-row addresses comprise n single-row addresses and m single-row addresses in L single-row addresses, a single enabling duration of word lines pointed to by the n single-row addresses is greater than a preset duration, the m single-row addresses rank top m in occurrence frequency, the L single-row addresses are corresponding to word lines turned on between adjacent refresh commands, n is a natural number, and m is a positive integer; and
  receive a first random number, the first random number being a positive integer less than or equal to n+m, and after receiving the first random number, output an i-th received single-row address, wherein i is equal to the first random number;
 a row hammer address generation sub-circuit, connected to an output end of the random output sub-circuit, and configured to output a row hammer address corresponding to the received single-row address; and
 a signal selector, configured to receive a general refresh address and the row hammer address, and output address information, wherein the address information is the row hammer address or the address information is the row hammer address and the general refresh address, and the address information acts as a refresh object corresponding to the refresh command.

2. The refresh control circuit of claim 1, wherein the random output sub-circuit is configured to:
sequentially receive and sequentially store the plurality of single-row addresses, and to output a seed address after receiving the first random number, the seed address comprising the i-th received single-row address; and
delete the stored seed address after outputting the seed address.

3. The refresh control circuit of claim 2, wherein the random output sub-circuit is further configured to delete all the stored single-row addresses after outputting the seed address.

4. The refresh control circuit of claim 1, further comprising:
a first random sub-circuit, configured to randomly generate and output a first positive integer; and
a remainder calculation sub-circuit, respectively connected to the random output sub-circuit and the first random sub-circuit, and configured to obtain a value of n+m and the first positive integer, and calculate a remainder of the first positive integer divided by the value of n+m, and output a value of the remainder plus 1 as the first random number.

5. The refresh control circuit of claim 1, further comprising:
a timeout selection sub-circuit, connected to an input end of the random output sub-circuit, and configured to: sequentially receive L row activation commands, L pre-charging commands, and the L single-row addresses corresponding to the L row activation commands, wherein each row activation command corresponds to a single-row address, the row activation command is configured to turn on a word line pointed to by the single-row address, and the pre-charging command is configured to turn off the word line; and when a single enabling duration of the n word lines is greater than the preset duration, output the n single-row addresses corresponding to the n word lines, wherein $0 \leq n \leq L$.

6. The refresh control circuit of claim 5, wherein the timeout selection sub-circuit comprises:
a timing sub-circuit, configured to receive the row activation commands and the pre-charging commands to obtain the single enabling duration, and when the single enabling duration is greater than the preset duration, output timeout signals; and
a first latch sub-circuit, connected to an output end of the timing sub-circuit, and configured to: receive each of the L single-row addresses one by one, and receive, one by one, each timeout signal outputted by the timing sub-circuit, so as to output n single-row addresses corresponding to the n timeout signals; and when the timeout signals are received, output the single-row address last received before the timeout signals arrive.

7. The refresh control circuit of claim 1, further comprising:
a high-frequency selection sub-circuit, connected to an input end of the random output sub-circuit, and configured to receive the L single-row addresses, and output, one by one, the m single-row addresses ranking top m in occurrence frequency in the L single-row addresses.

8. The refresh control circuit of claim 7, wherein the high-frequency selection sub-circuit comprises:
a random capturing sub-circuit, configured to receive the L single-row addresses, and randomly output b single-row addresses in the L single-row addresses, wherein $L > b > 1$; and
a frequency comparison sub-circuit, connected to an output end of the random capturing sub-circuit, and configured to analyze and output m single-row addresses ranking top m in occurrence frequency in the b single-row addresses.

9. The refresh control circuit of claim 8, wherein the random capturing sub-circuit comprises:
a control sub-circuit, configured to generate and output trigger signals at b random time points; and
a second latch sub-circuit, configured to: receive each of the L single-row addresses one by one, and receive, one by one, each trigger signal outputted by the control sub-circuit, so as to output b single-row addresses corresponding to the b trigger signals; and when the trigger signals are received, output the single-row address last received before the trigger signals arrive.

10. The refresh control circuit of claim 9, wherein the control sub-circuit comprises:
a second random sub-circuit, configured to generate and output a second random number, the second random number being a positive integer;
a first counting sub-circuit, configured to receive L row activation commands one by one, and count the number of the received row activation commands to output a first count value, wherein each row activation command corresponds to a single-row address, and the L row activation commands correspond to the L single-row addresses; and
a value comparison sub-circuit, connected to an output end and a reset end of the second random sub-circuit, connected to an output end and a reset end of the first counting sub-circuit, connected to an input end of the second latch sub-circuit, and configured to: receive the second random number and the first count value; and when the first count value is equal to the second random number, output the trigger signals, and reset the second random sub-circuit and the first counting sub-circuit, to enable the second random sub-circuit to generate and output a new second random number, and to enable the first counting sub-circuit to count from zero again.

11. The refresh control circuit of claim 1, wherein the signal selector is further configured to receive a selection signal, wherein
before receiving the selection signal, the signal selector is further configured to receive and output each general refresh address sequentially; and
after receiving the selection signal, the signal selector is further configured to stop outputting the general refresh address, and receive and output the row hammer addresses,
wherein the selection signal represents that the signal selector has received j−2 general refresh addresses, wherein j is the number of refresh rows corresponding to each refresh command, and j>2.

12. The refresh control circuit of claim 11, further comprising: a second counting sub-circuit, connected to a control end of the signal selector, and configured to count the number of the general refresh addresses received by the signal selector to obtain a second count value, and when the second count value is equal to j−2, output the selection signal.

13. The refresh control circuit of claim 12, wherein after the signal selector outputs the general refresh addresses and the row hammer addresses, the signal selector is configured to reset the second counting sub-circuit to stop outputting the selection signal, and control the second counting sub-circuit to count from zero again.

14. The refresh control circuit of claim 12, further comprising: a general refresh address generation sub-circuit, configured to generate and output at least one of the general refresh addresses, wherein an output end of the general refresh address generation sub-circuit is respectively connected to an input end of the signal selector and an input end of the second counting sub-circuit, and the second counting sub-circuit is configured to receive the at least one of the general refresh addresses outputted by the general refresh address generation sub-circuit.

15. A memory, comprising a refresh control circuit that comprises:
a random output sub-circuit, configured to:
sequentially receive a plurality of single-row addresses, wherein the plurality of single-row addresses comprise n single-row addresses and m single-row addresses in L single-row addresses, a single enabling duration of word lines pointed to by the n single-row addresses is greater than a preset duration, the m single-row addresses rank top m in occurrence frequency, the L single-row addresses are corresponding to word lines turned on between adjacent refresh commands, n is a natural number, and m is a positive integer; and
receive a first random number, the first random number being a positive integer less than or equal to n+m, and after receiving the first random number, output an i-th received single-row address, wherein i is equal to the first random number;
a row hammer address generation sub-circuit, connected to an output end of the random output sub-circuit, and configured to output a row hammer address corresponding to the received single-row address; and
a signal selector, configured to receive a general refresh address and the row hammer address, and output address information, wherein the address information is the row hammer address or the address information is the row hammer address and the general refresh address, and the address information acts as a refresh object corresponding to the refresh command.

16. The memory of claim 15, wherein the refresh control circuit further comprises:
a first random sub-circuit, configured to randomly generate and output a first positive integer; and
a remainder calculation sub-circuit, respectively connected to the random output sub-circuit and the first random sub-circuit, and configured to obtain a value of n+m and the first positive integer, and calculate a remainder of the first positive integer divided by the value of n+m, and output a value of the remainder plus 1 as the first random number.

17. The memory of claim 15, wherein the refresh control circuit further comprises:
a timeout selection sub-circuit, connected to an input end of the random output sub-circuit, and configured to: sequentially receive L row activation commands, L pre-charging commands, and the L single-row addresses corresponding to the L row activation commands, wherein each row activation command corresponds to a single-row address, the row activation command is configured to turn on a word line pointed to by the single-row address, and the pre-charging command is configured to turn off the word line; and when a single enabling duration of the n word lines is greater than the preset duration, output the n single-row addresses corresponding to the n word lines, wherein $0 \leq n \leq L$.

18. The memory of claim 15, wherein the refresh control circuit further comprises:
a high-frequency selection sub-circuit, connected to an input end of the random output sub-circuit, and configured to receive the L single-row addresses, and output, one by one, the m single-row addresses ranking top m in occurrence frequency in the L single-row addresses.

19. The memory of claim 15, wherein the signal selector is further configured to receive a selection signal, wherein
before receiving the selection signal, the signal selector is further configured to receive and output each general refresh address sequentially; and
after receiving the selection signal, the signal selector is further configured to stop outputting the general refresh address, and receive and output the row hammer addresses,
wherein the selection signal represents that the signal selector has received j−2 general refresh addresses, wherein j is the number of refresh rows corresponding to each refresh command, and j>2.

20. The memory of claim 19, wherein the refresh control circuit further comprises: a second counting sub-circuit, connected to a control end of the signal selector, and configured to count the number of the general refresh addresses received by the signal selector to obtain a second count value, and when the second count value is equal to j−2, output the selection signal.

* * * * *